(12) United States Patent
Huang et al.

(10) Patent No.: US 8,962,494 B2
(45) Date of Patent: Feb. 24, 2015

(54) METHOD OF MANUFACTURING DUAL GATE OXIDE DEVICES

(71) Applicant: Shanghai Huali Microelectronics Corporation, Shanghai (CN)

(72) Inventors: Jun Huang, Shanghai (CN); Zhibiao Mao, Shanghai (CN); Ermin Chong, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 0 days.

(21) Appl. No.: 14/040,737

(22) Filed: Sep. 30, 2013

(65) Prior Publication Data
US 2014/0342565 A1 Nov. 20, 2014

(30) Foreign Application Priority Data
May 14, 2013 (CN) .......................... 2013 1 0177577

(51) Int. Cl.
| *H01L 21/31* | (2006.01) |
| *H01L 21/469* | (2006.01) |
| *H01L 21/311* | (2006.01) |
| *H01L 21/027* | (2006.01) |
| *H01L 21/3213* | (2006.01) |
| *H01L 21/033* | (2006.01) |
| *H01L 21/308* | (2006.01) |
| *H01L 21/28* | (2006.01) |

(52) U.S. Cl.
CPC ...... *H01L 21/31144* (2013.01); *H01L 21/0273* (2013.01); *H01L 21/0274* (2013.01); *H01L 21/32139* (2013.01); *H01L 21/0337* (2013.01); *H01L 21/3088* (2013.01); *H01L 21/28123* (2013.01); *H01L 21/0338* (2013.01)
USPC ........... 438/781; 438/585; 438/725; 438/780

(58) Field of Classification Search
CPC ..................... H01L 21/0273; H01L 21/32139; H01L 21/0337; H01L 21/28123; H01L 21/31144; H01L 21/0338; H01L 21/3088; H01L 21/0274
USPC .................................. 438/725, 585, 780, 781
See application file for complete search history.

(56) References Cited

U.S. PATENT DOCUMENTS

| 8,728,335 B2* | 5/2014 | Fu et al. ........................ 216/41 |
| 2005/0255696 A1* | 11/2005 | Makiyama et al. ........... 438/637 |
| 2006/0046451 A1* | 3/2006 | Scott ............................. 438/585 |
| 2008/0122110 A1* | 5/2008 | Yang et al. .................... 257/774 |
| 2009/0068807 A1* | 3/2009 | Karve et al. ................... 438/275 |
| 2009/0203224 A1* | 8/2009 | Shih et al. ..................... 438/780 |
| 2012/0028434 A1* | 2/2012 | Lee et al. ...................... 438/400 |
| 2014/0024186 A1* | 1/2014 | Yoo et al. ...................... 438/275 |

* cited by examiner

Primary Examiner — Bac Au

(57) ABSTRACT

The present invention provides method of manufacturing dual gate oxide devices. The method comprises coating photoresist on the substrate which is deposited by an oxide thin film; removing some of the photoresist by exposure and development to divide the oxide thin film into a first area to be etched and a second area coated by the remained photoresist; coating RELACS material on the remained photoresist and heating to form a protective film based on the crosslinking reaction between the RELACS material and the high molecular compounds in the photoresist; performing UV radiation to strengthen and cure the protective film; removing the oxide thin film in the first area by etching and removing the remained photoresist; and depositing again an oxide firm to form an oxide layer of different thickness in the first area and the second area so as to form a dual gate oxide structure.

13 Claims, 3 Drawing Sheets

METHOD OF MANUFACTURING DUAL GATE OXIDE DEVICES

CROSS-REFERENCE TO RELATED APPLICATION

This application claims the priority benefit of China application serial no. 201310177577.5, filed May 14, 2013. All disclosure of the China application is incorporated herein by reference.

FIELD OF THE INVENTION

The present invention relates to the field of semiconductor fabrication technology and particularly to a method of manufacturing dual gate oxide devices.

BACKGROUND OF THE INVENTION

With the development of semiconductor technology, one integrated circuit (IC) chip will integrate pluralities of functional devices, which comprise different Field Effect Transistors (FETs) respectively. The multiple gate oxide process has become a common method to form different FETs in a same chip.

Nowadays, varieties of multiple gate oxide processes are provided. FIG. 1A to FIG. 1D show cross-sectional views of a dual gate oxide device in the conventional manufacturing process. As shown in FIG. 1A, the silicon substrate 11 with shallow trench isolations 12 formed therein and silicon oxide thin film 13 deposited thereon is coated with photoresist 14. As shown in FIG. 1B, exposure and development is applied to the photoresist 14 so as to divide the silicon oxide thin film 13 into an area 15 which is to be etched and an area 16 which is covered with the remained photoresist 14. Then the silicon oxide thin film 13 in the area 15 is completely removed by wet etching as shown in FIG. 1C. Afterwards, as shown in FIG. 1D, the rest of the photoresist 14 is removed and then silicon oxide is deposited again to form silicon oxide films with different thickness on the silicon oxide film 13 in areas 15 and 16, so as to form the so-called dual gate oxide structure. Then, different FETs can be manufactured in the areas 15 and 16.

In the conventional method mentioned above, the wet etching process for the silicon oxide thin film 13 in the area 15 is performed by placing the silicon substrate 11 with the silicon oxide thin film 13 into an acid solution such as HF. However, when the acid solution etches the silicon oxide thin film 13, it also makes effects on the photoresist 14 and forms process defects mainly including photoresist residue and SiC deposition. Specifically, the photoresist residue is formed because the photoresist will be eroded by the acid solution and some of the high molecular compounds therein will be delaminated, which will form the defects on the silicon substrate surface. On the other hand, the formation mechanism of the SiC deposition is that with the reaction of the acid solution HF and the silicon oxide, SiF6 is formed, the SiF6 then will react with the high molecular compounds in the photoresist to produce SiC particles, and then the SiC deposition is formed on the substrate.

To solve the problems mentioned above, following methods are utilized to prevent forming photoresist defects during the wet etching process: 1) baking the photoresist layer after the exposure and development so as to increase its density, thereby making the acid solution difficult to immerse into the gaps between the high molecular compounds to react with the compounds and form the defects; 2) performing UV curing after the exposure and development to form cross-linked bond with the high molecular compounds on the surface of the photoresist, which can improve the erosion-resisting ability of the photoresist to the acid solution.

However, there still exist some problems to be solved in the conventional methods of preventing photoresist defects mentioned above. In the first method, the baking temperature cannot be too high and the baking time cannot be too long, otherwise the photolithography patterns of the photoresist will be deformed, which may further have negative effects on the throughput. Moreover, the density of the baked photoresist layer may not meet the requirements of erosion-resistance to acid solutions due to the temperature and time limitations. In the second method, the UV curing process which is performed after the photolithography process may result in contractions in the thickness of the photoresist layer and the linewidth of the photoresist pattern. Generally, the contraction rate of the photoresist thickness can be 15% to 25%, and the linewidth can be reduced by 10~30 nm compared with that after the exposure and development process. As a result, the linewidth as well as the quality of the dual gate oxide device to be formed later may be affected.

SUMMARY OF THE INVENTION

Accordingly, at least one object of the present invention is to provide a method of manufacturing dual gate oxide devices which can prevent photoresist defects forming during the processes and minimize the negative effects on the device linewidth by the processes.

To achieve these and other advantages and in accordance with the objective of the invention, as embodied and broadly described herein, the invention provides a method of manufacturing dual gate oxide devices including the following steps:

Step S01, coating photoresist on a substrate which is deposited by an oxide thin film;

Step S02, removing some of the photoresist by exposure and development to divide the oxide thin film into a first area which is to be etched and a second area which is coated by the remained photoresist;

Step S03, coating Resolution Enhancement Lithography Assisted by Chemical Shrink (RELACS) material on the remained photoresist and heating so as to form a protective film based on the crosslinking reaction between the RELACS material and the high molecular compounds in the photoresist;

Step S04, performing UV radiation to the photoresist surface treated by the step S03 to strengthen and cure the protective film;

Step S05, removing the oxide thin film in the first area by an etching process, and removing the remained photoresist;

Step S06, depositing again an oxide film to form oxide films of different thickness in the first area and the second area so as to form a dual gate oxide structure.

Furthermore, the photoresist is applicable in I-line or 248 nm or 198 nm or EUV lithography process.

Furthermore, the RELACS material is water soluble polymer material comprising alkylamino groups. Preferably, the water soluble polymer material is acrylate comprising alkylamino groups or methacrylate comprising alkylamino groups.

Furthermore, the heating temperature in the step S03 is 80° C. to 180° C., the heating time is 15 seconds to 300 seconds. Preferably, the heating temperature is 90° C. to 170° C., the heating time is 30 seconds to 120 seconds.

Furthermore, the wavelength of the UV radiation is in the range from 280 nm to 330 nm, the UV radiation temperature is 100° C. to 180° C.

Furthermore, the oxide layer is a silicon oxide layer, the substrate is a silicon substrate.

Furthermore, the method further comprises removing the unreacted RELACS material after the step S03.

Furthermore, the unreacted RELACS material is removed by deionized water or deionized water solution containing surfactant.

Furthermore, a same imaging machine is utilized in the step S02, the step S03 and the step S04.

Furthermore, the etching process in the step S05 is a wet etching process.

The method of manufacturing dual gate oxide devices in the present invention can effectively enhance the density of the photoresist before the etching process so as to improve its erosion-resistance to acid solutions and reduce the risk of forming photoresist defects during the etching process. Additionally, the linewidth of the photoresist pattern increases 10 nm to 20 nm by the chemical curing treatment utilizing the RELACS material, which will compensate the 10 nm to 30 nm linewidth decrease of the photoresist pattern due to the UV radiation, so that the effects on the device linewidth by the manufacturing process can be minimized.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Figure 1A:
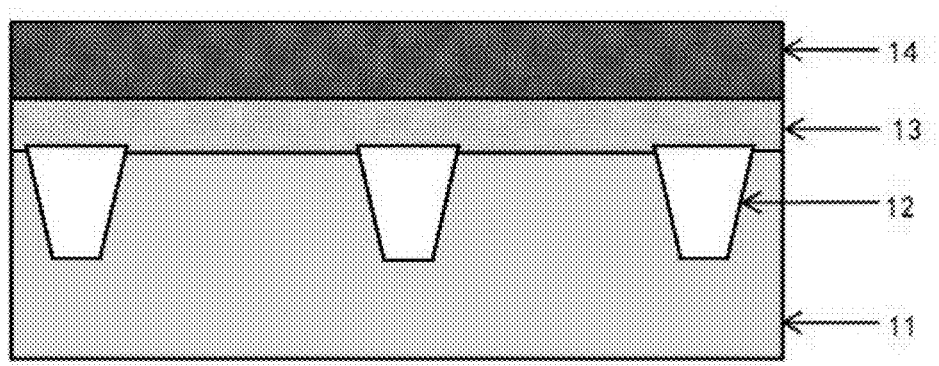
FIG. 1A to FIG. 1D are cross-sectional views of a dual gate oxide device in the conventional manufacturing process.
Figure 1B:
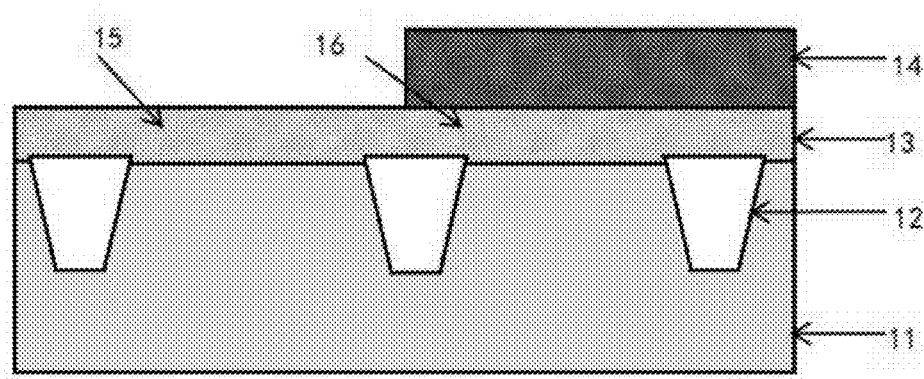
Figure 1C:
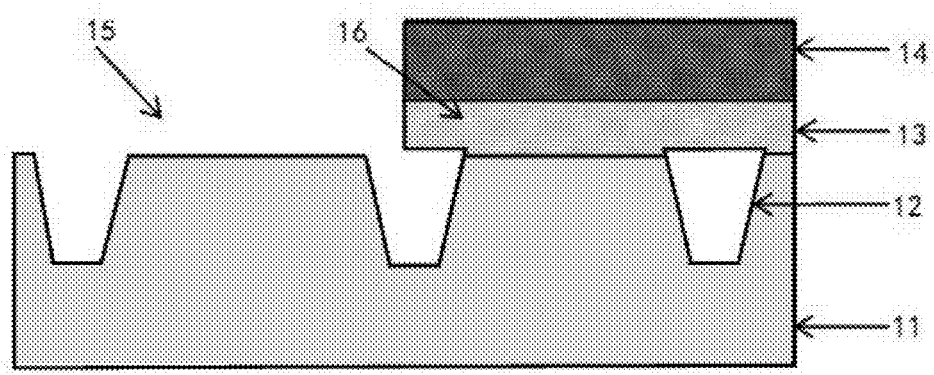
Figure 1D:
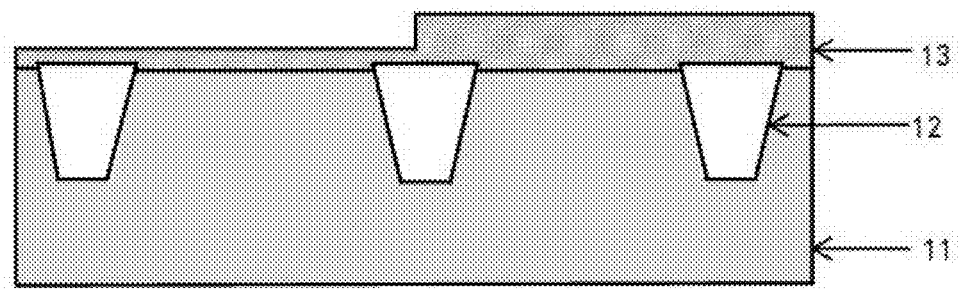

The method of manufacturing dual gate oxide devices of the present invention will be described in further details hereinafter with respect to the embodiments and the accompanying drawings.

The present invention is described with reference to the attached figures, wherein like reference numerals are used throughout the figures to designate similar or equivalent elements. The figures are not drawn to scale and they are provided merely to illustrate the invention. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention.

Figure 2A:
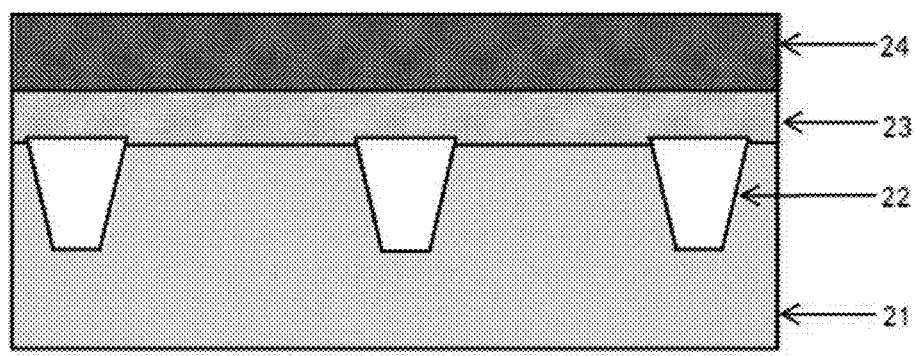
FIG. 2A to FIG. 2E is a cross-sectional views of a dual gate oxide device in the manufacturing process of the present invention.

Referring to FIG. 2A to FIG. 2E, in one embodiment of the present invention, the method of manufacturing dual gate oxide comprises the following steps:

In the step S01, the substrate 21 having shallow trench isolations 22 formed therein and an oxide layer 23 deposited thereon is coated with a photoresist 24, as shown in FIG. 2A. In the embodiment, the substrate 21 is a silicon substrate, the oxide layer 23 is a silicon oxide layer, the photoresist 24 is applicable in the I-line lithography process.

Figure 2B:
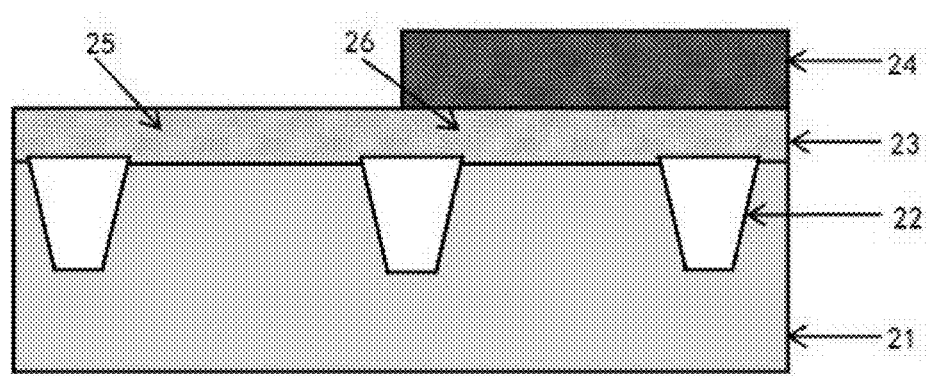

In the step 102, some of the photoresist 24 is removed by exposure and development, thus to divide the oxide layer 23 into a first area 25 and a second area 26 as shown in FIG. 2B. Wherein, the first area 25 is exposed to be etched later and the second area 26 is covered by the remained photoresist 14.

Figure 2C:
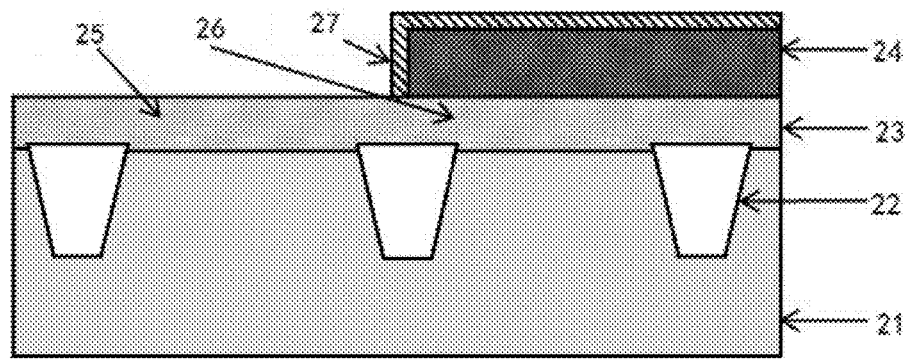
Figure 2D:
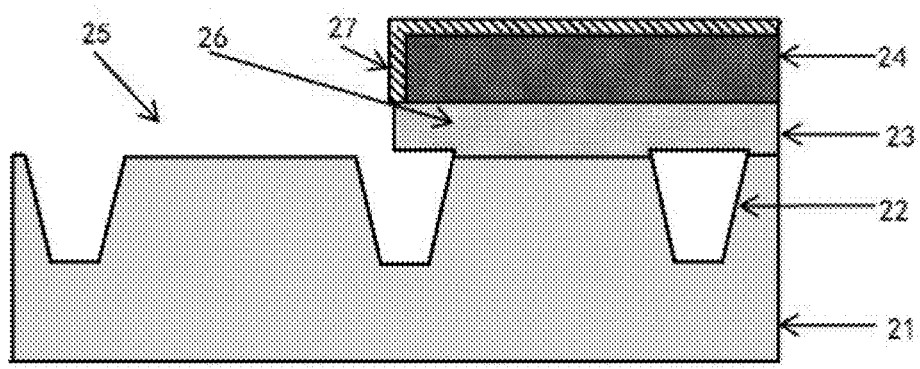

In the step S03, the remained photoresist 14 is coated by Resolution Enhancement Lithography Assisted by Chemical Shrink (RELACS) material and a heat treatment is applied thereafter. The heat treatment cures the photoresist pattern, and triggers the crosslinking reaction between the RELACS material and the high molecular compounds in the photoresist 24, thereby curing the photoresist surface chemically and forming a protective film 27 on parts of the photoresist 24 surface. Preferably, the unreacted RELACS material is removed then, as shown in FIG. 2C. Wherein, in the embodiment, the RELACS material is the RELACS product R607 or SH-114 provided by AZ Electronic Materials USA Corp., which is commercially available; the heat treatment is applied at 120° C. for 60 seconds; and the unreacted RELACS material is removed by deionized water.

In the step S04, UV radiation is applied to the photoresist 24 treated after the step S03 to strengthen and cure the photoresist 24 surface further, and then the protective film 27 will form on the whole surface of the photoresist 24. Since the chemical curing treatment by the RELACS material increases the photoresist pattern linewidth by 10 to 20 nm while the UV curing treatment by the UV radiation decreases the pattern linewidth by 10 to 30 nm, the linewidth deformation can be compensated and the effects on the linewidth of the device to be formed later by the manufacturing processes can be minimized.

Figure 2E:
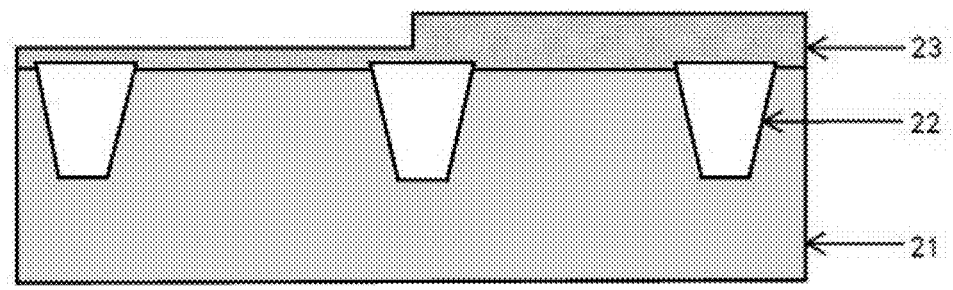

In the step S05, as shown in FIG. 2E, the oxide film in the first area 25 is removed completely by an etching process. The etching process is a wet etching process in the embodiment.

In the step S06, the remained photoresist is removed and an oxide thin film is deposited again thereafter. Thus an oxide layer having different thickness to get a dual gate oxide structure is formed, as shown in FIG. 2E.

Then, in the step S07, different FETs are manufactured according to the dual gate oxide structure in the first and second areas 25, 26.

In the practical application, the photoresist 24 can also be applicable in the 248 nm or 193 nm or EUV lithography process; the RELACS material can be other soluble polymer materials comprising alkylamino groups, preferably to be acrylate comprising alkylamino groups or methacrylate comprising alkylamino groups, such as the following compound I and II disclosed by U.S. Pat. Nos. 7,745,077 and 7,923,200 respectively:

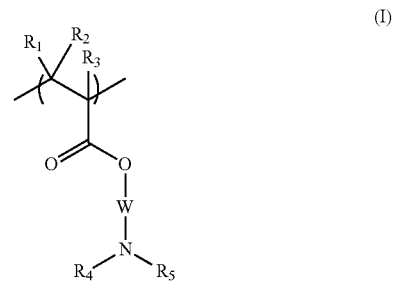

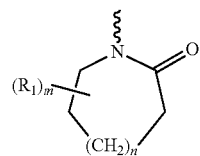

Wherein, in composition I, R1 to R5 are independently selected from hydrogen and $C_1$ to $C_6$ alkylthe, and W is $C_1$ to $C_6$ alkyl; in composition II, R1 is independently selected hydrogen, $C_1$-$C_4$ alkyl, $C_1$-$C_6$ alkyl alcohol, hydroxy(OH), amine (NH2), carboxylic acid, and amide (CONH2), ⸦ represents the attachment to the polymer, m=1-6, and n=1-4. The heating temperature in the step S03 can be in the range from 80° C. to 180° C., and preferably to be 90° C. to 170° C.; the heating time can be in the range from 15 seconds to 300 seconds, and preferably to be 30 seconds to 120 seconds. The wavelength of the UV radiation can be in the range from 280 nm to 330 nm, and the UV radiation temperature can be 100° C. to 180° C. The process conditions of the heat treatment and the UV radiation can be adjusted according to actual requirements. In addition, Deionized water solution containing surfactant can also be applied to remove the unreacted RELACS material in the step S03. Furthermore, in the step S02, the step S03 and the step S04, a same imaging machine is utilized to perform the processes.

It should be understood that the invention is focus on the curing of the photoresist through chemical curing and UV curing, so as to avoid the negative effects caused by the conventional manufacturing processes, such as the erosion of the photoresist and the device. Therefore, other well-known specific processes such as the formation of the shallow trench isolations, the exposure and development process, the removing of the remained photoresist, the coating process, the UV radiation, the wet etching technology, the deposition process etc, which are not shown in detail, can all refer to the conventional processes.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of manufacturing dual gate oxide devices comprising the following steps:
   Step S01, coating photoresist on a substrate which is deposited by an oxide thin film;
   Step S02, removing some of the photoresist by exposure and development to divide the oxide thin film into a first area which is to be etched and a second area which is coated by the remained photoresist;
   Step S03, performing chemical curing treatment by coating Resolution Enhancement Lithography Assisted by Chemical Shrink material having water soluble polymer material on the remained photoresist and heating, so as to form a protective film based on the crosslinking reaction between the Resolution Enhancement Lithography Assisted by Chemical Shrink material and the high molecular compounds in the photoresist;
   Step S04, performing UV radiation to the photoresist surface treated by step S03 to strengthen and cure the protective film, wherein the decrease of the photoresist pattern linewidth caused by the UV radiation is compensated by the increase of the photoresist pattern linewidth caused by the chemical curing treatment;
   Step S05, removing the oxide thin film in the first area by an etching process and removing the remained photoresist;
   Step S06, depositing again an oxide film to form an oxide layer of different thickness in the first area and the second area so as to form a dual gate oxide structure.

2. The method of manufacturing dual gate oxide devices according to claim 1, wherein the photoresist is applicable in I-line or 248 nm or 198 nm or EUV lithography process.

3. The method of manufacturing dual gate oxide devices according to claim 1, wherein the water soluble polymer material comprises alkylamino groups.

4. The method of manufacturing dual gate oxide devices according to claim 3, wherein the water soluble polymer material is acrylate comprising alkylamino groups or methacrylate comprising alkylamino groups.

5. The method of manufacturing dual gate oxide devices according to claim 1, wherein the heating temperature in the step S03 is 80° C. to 180° C. the heating time is 15 seconds to 300 seconds.

6. The method of manufacturing dual gate oxide devices according to claim 5, the heating temperature is 90° C. to 170° C., the heating time is 30 seconds to 120 seconds.

7. The method of manufacturing dual gate oxide devices according to claim 1, wherein the wavelength of the UV radiation in the step S04 is in the range from 280 nm to 330 nm, the UV radiation temperature is 100° C. to 180° C.

8. The method of manufacturing dual gate oxide devices according to claim 1, wherein the oxide layer is a silicon oxide layer, the substrate is a silicon substrate.

9. The method of manufacturing dual gate oxide devices according to claim 1, wherein the method further comprises removing the unreacted Resolution Enhancement Lithography Assisted by Chemical Shrink material after the step S03.

10. The method of manufacturing dual gate oxide devices according to claim 9, wherein the unreacted Resolution Enhancement Lithography Assisted by Chemical Shrink material is removed by deionized water or deionized water solution containing surfactant.

11. The method of manufacturing dual gate oxide devices according to claim 1, wherein a same imaging machine is utilized in the step S02, step S03 and step S04.

12. The method of manufacturing dual gate oxide devices according to claim 1, wherein the etching process in the step S05 is a wet etching process.

13. The method of manufacturing dual gate oxide devices according to claim 1, wherein the protective film is formed on parts of the photoresist surface by the step S03; the protective film is formed on the whole photoresist surface by the step S04.

* * * * *